(12) United States Patent
Weber et al.

(10) Patent No.: US 9,137,542 B2
(45) Date of Patent: Sep. 15, 2015

(54) AUDIO ENCODING OF CONTROL SIGNALS FOR DISPLAYS

(71) Applicant: 3M INNOVATIVE PROPERTIES COMPANY, St. Paul, MN (US)

(72) Inventors: Brian T. Weber, Saint Paul, MN (US); Benjamin K. Stein, Lino Lakes, MN (US); Patrick M. Campbell, Saint Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 251 days.

(21) Appl. No.: 13/948,382

(22) Filed: Jul. 23, 2013

(65) Prior Publication Data

US 2015/0029395 A1    Jan. 29, 2015

(51) Int. Cl.
| | |
|---|---|
| H04N 19/44 | (2014.01) |
| H04N 21/434 | (2011.01) |
| H04N 21/6336 | (2011.01) |
| G02F 1/1334 | (2006.01) |
| H01L 27/32 | (2006.01) |
| H04N 9/12 | (2006.01) |

(52) U.S. Cl.
CPC ............. *H04N 19/44* (2014.11); *G02F 1/1334* (2013.01); *H01L 27/3232* (2013.01); *H04N 9/12* (2013.01); *H04N 21/434* (2013.01); *H04N 21/6336* (2013.01)

(58) Field of Classification Search
CPC . H04N 21/434; H04N 19/44; H04N 21/6336; G02F 1/1334; G02F 2201/44; G09G 2300/023; H01L 27/3232
USPC .......... 353/15; 348/578; 345/473, 474, 440.1; 40/442
See application file for complete search history.

(56) References Cited

U.S. PATENT DOCUMENTS

| | | |
|---|---|---|
| 3,576,364 A | 4/1971 | Zanoni |
| 3,718,712 A | 2/1973 | Tushaus |
| 5,516,455 A | 5/1996 | Jacobine |
| 6,671,008 B1 | 12/2003 | Li |
| 6,996,532 B2 | 2/2006 | Thomas |
| 7,005,394 B1 | 2/2006 | Ylitalo |
| 7,009,665 B2 | 3/2006 | Li |

(Continued)

FOREIGN PATENT DOCUMENTS

| | | |
|---|---|---|
| CN | 201138554 | 10/2008 |
| DE | 4215868 | 11/1993 |

(Continued)

OTHER PUBLICATIONS

Fuh, "Studies of Polymer-Stabilized Cholesteric Texture Films", Display Technologies III, Proceedings. Of SPIE, Jun. 30, 2000, vol. 4079, pp. 184-190.

(Continued)

*Primary Examiner* — William C Dowling
*Assistant Examiner* — Magda Cruz

(57) ABSTRACT

Synchronizing video content projected onto a transparent display with switching of pixels in the display. The transparent display has pixels capable of switching between a clear state to make portions of the display transparent and a hazy state to display the projected video. A decoder receives and decodes audio content associated with the video content in order to control the switching of the pixels in the display such that the video content is projected onto pixels in the hazy state.

20 Claims, 2 Drawing Sheets

(56) References Cited

U.S. PATENT DOCUMENTS

| | | | |
|---|---|---|---|
| 7,259,730 B2 | 8/2007 | O'Keeffe | |
| 7,336,271 B2 | 2/2008 | Ozeki | |
| 7,862,898 B2 | 1/2011 | Sherman | |
| 7,892,649 B2 | 2/2011 | Sherman | |
| 8,042,949 B2 | 10/2011 | Taylor | |
| 8,442,264 B2 | 5/2013 | Rhoads | |
| 2006/0087585 A1* | 4/2006 | Seo et al. | 348/385.1 |
| 2006/0182401 A1 | 8/2006 | Risser | |
| 2006/0216523 A1 | 9/2006 | Takaki | |
| 2007/0082969 A1 | 4/2007 | Malik | |
| 2009/0213110 A1* | 8/2009 | Kato et al. | 345/418 |
| 2009/0219253 A1 | 9/2009 | Izadi | |
| 2010/0060826 A1 | 3/2010 | Duponchel | |
| 2010/0066928 A1 | 3/2010 | Pelfrey | |
| 2010/0294679 A1 | 11/2010 | Griffiths | |
| 2010/0309390 A1* | 12/2010 | Plut | 348/744 |
| 2011/0069242 A1* | 3/2011 | Mashitani et al. | 349/5 |
| 2011/0080553 A1 | 4/2011 | Sun | |
| 2012/0203560 A1 | 8/2012 | Poulsen | |
| 2014/0132909 A1* | 5/2014 | Wardhana et al. | 349/155 |

FOREIGN PATENT DOCUMENTS

| | | |
|---|---|---|
| EP | 2362384 | 8/2011 |
| GB | 1380714 | 1/1975 |
| GB | 2066992 | 7/1981 |
| JP | 2007095472 | 4/2007 |
| KR | 2011-0030410 | 3/2011 |
| WO | 02/39475 | 5/2002 |
| WO | 2009/150579 | 12/2009 |
| WO | 2013/173070 | 11/2013 |

OTHER PUBLICATIONS

Li, "Multifunctional window glazing", SPIE Newsroom, Mar. 19, 2008, 2 pages.

Satoh, "80.2: 60-inch Highly Transparent See-through Active Matrix Display without Polarizers", SID Symposium Digest of Technical Papers, May 2010, vol. 41, No. 1, pp. 1192-1195.

Mauer, Cholesteric Reflectors with a Color Pattern, Paper 26.1, 1994 SID International Symposium, Digest of Technical Papers, vol. XXV, May 1994, pp. 399-402.

Roberts, U.S. Appl. No. 13/675,130, entitled "Optical Stack Including Light Extraction Layer and Polymer Dispersed Liquid Crystal Layer", filed on Nov. 13, 2012.

Wardhana, U.S. Appl. No. 13/675,121, entitled "Switchable Transparent Display," filed Nov. 13, 2012.

Weber, U.S. Appl. No. 13/948,371, entitled "Addressable Switchable Transparent Display," filed Jul. 23, 2013.

\* cited by examiner

AUDIO ENCODING OF CONTROL SIGNALS FOR DISPLAYS

BACKGROUND

A switchable transparent display screen is useful for attracting consumer attention and providing information to customers. While in its transparent state, it allows customers to see through the screen and view products behind it. One such type of screen uses Polymer Dispersed Liquid Crystal (PDLC), which is a mixture of liquid crystal in a cured polymer network and is switchable between light transmitting and light scattering states. PDLC displays can be divided into pixels, drawing more attention by displaying projected video content on light scattering pixels while allowing customers to view the product through light transmitting pixels. For a multi-pixel PDLC display to be functional, the pixels must be synchronized with video content such that the video content is projected onto light scattering pixels for display while the other pixels can be set to a clear state. As the video content changes, the pixels need to be reset so that the video content continues to be projected onto the light scattering pixels for display.

SUMMARY

A system for synchronizing projected video content with a transparent display, consistent with the present invention, includes a projector for projecting video content having associated audio content and a transparent display for receiving and displaying the projected video content. The transparent display has pixels capable of switching between a clear state to make portions of the display transparent and a hazy state to display the projected video. A decoder receives and decodes the audio content in order to control the switching of the pixels in the display with the projected video content such that the video content is projected onto pixels in the hazy state.

A method for synchronizing projected video content with a transparent display, consistent with the present invention, comprises projecting video content having associated audio content to a transparent display and displaying the projected video content on the transparent display. The method also includes decoding the audio content in order to control the switching of the pixels in the display between clear and hazy states such that the projected video content is projected onto pixels in the hazy state.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the present invention include a method of encoding a control signal using audio tones. This signal can be sine or square waves with the frequency of the waves determining the data set being sent. The frequency can be in the ultrasonic range to send data faster and free the audio line for traditional use of providing audio with video. This signal can also be a series of DTMF (dual-tone multi-frequency) tones. Each tone, or series of tones, can represent a different set of data. Using stereo audio allows for more data to be transmitted or for error correction to be performed. The control signal can be used to encode pixel data in segmented transparent displays.

An example of a transparent display is described in U.S. patent application Ser. No. 13/675,121, entitled "Switchable Transparent Display," and filed Nov. 13, 2012, which is incorporated herein by reference as if fully set forth.

Figure 1:
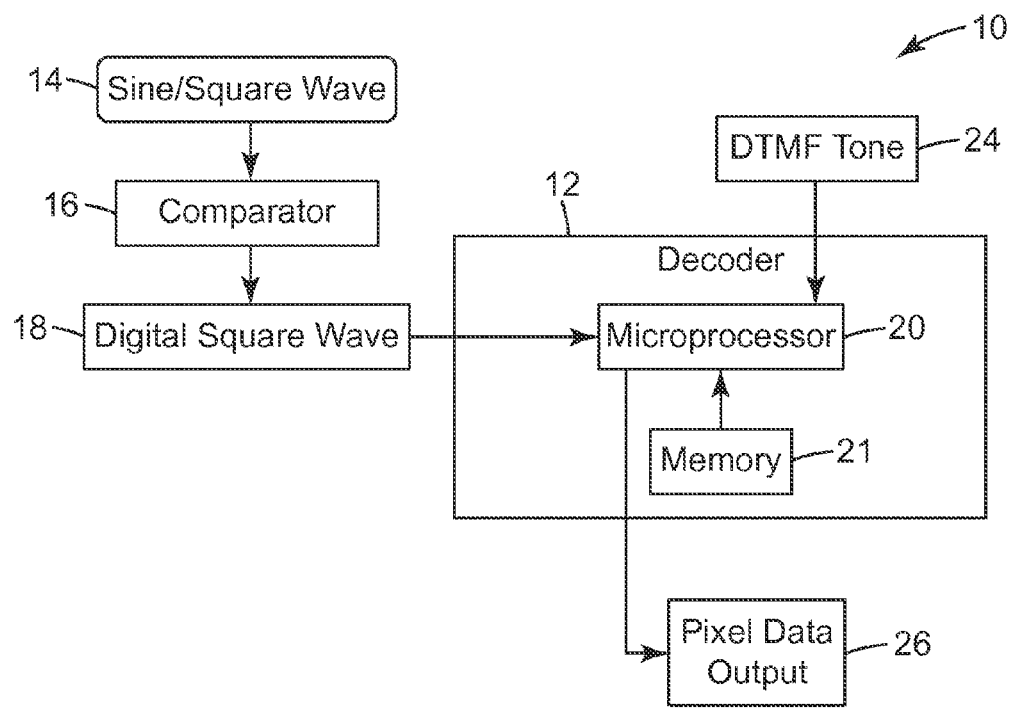
FIG. 1 is a block diagram of a system for audio encoding of data to control a transparent display.

FIG. 1 is a block diagram of a system 10 for audio encoding of data. System 10 includes a decoder 12 for decoding audio signals to provide a synchronization signal for a segmented transparent display. Decoder 12 includes a processor 20, or controller or circuitry, for decoding signals. A memory 21 can store software instructions for execution by processor 20. The audio signal can be square waves with the frequency of the waves determining the active pixels. The audio signal can also be a sine wave. Pixel information can be encoded in sine waves using several methods. Encoding can be done using a single frequency for each pixel arrangement. It can also be encoded using DTMF tones. Each DTMF tone, or series of tones, can represent one pixel state. Additionally, a series of tones can play at the beginning of a video and contain data for synchronized pixel switching for the duration of the video, enabling sound to be played with the corresponding video. A sine or square wave 14 is provided to a comparator 16, which generates a corresponding digital square wave 18.

Processor 20 received digital square wave 18 and decodes it to produce a pixel data output signal 26. Alternatively or in addition, processor 20 receives DTMF tones 24 and decodes the tones to generate pixel data output signal 26.

Figure 2:
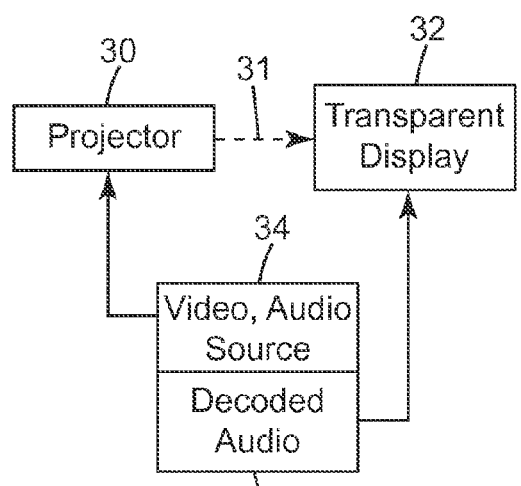
FIG. 2 is a block diagram illustrating use of audio encoding of data to synchronize video projected onto a transparent display with switching of the display.

FIG. 2 is a block diagram illustrating synchronizing a transparent display with video using audio encoding of data. A projector 30 projects content 31 for display on a transparent display 32 such as a PDLC display. A video and audio source 34 provides the video content with associated audio content to projector 30 for projection onto transparent display 32. The audio content from video and audio source 34 is decoded to provide decoded audio 36, corresponding with pixel data output 26, which is used to synchronize transparent display 32 with the video content projected upon it. As used herein, "video content" includes still images as well as moving images.

PDLC displays have pixels that can be switched to transmit light in a clear state, or scatter light in a hazy state. In the clear state, the pixels are sufficiently transparent to permit a viewer to see through those pixels of the display. In the hazy state, the pixels are sufficiently opaque for a viewer to see the video content projected upon those pixels of the display. The term "pixel" includes any particular portion or segment of the display. The display may have one or more pixels.

The pixels of the PDLC display must match the video content so that the video content is projected onto pixels having the hazy state. When creating video content, the encoded pixel data is recorded on the audio track of the video in video and audio source 34. When the video is played back with the video content projected onto transparent display 32, the encoded data will be played as an audio track, and decoded audio 36 is used to control switching of pixels in transparent display 32 such that the projected video is displayed on pixels in the hazy state. Preferably, decoded audio 36 is also used to set the pixels not receiving the projected video to the clear state.

Figure 3:
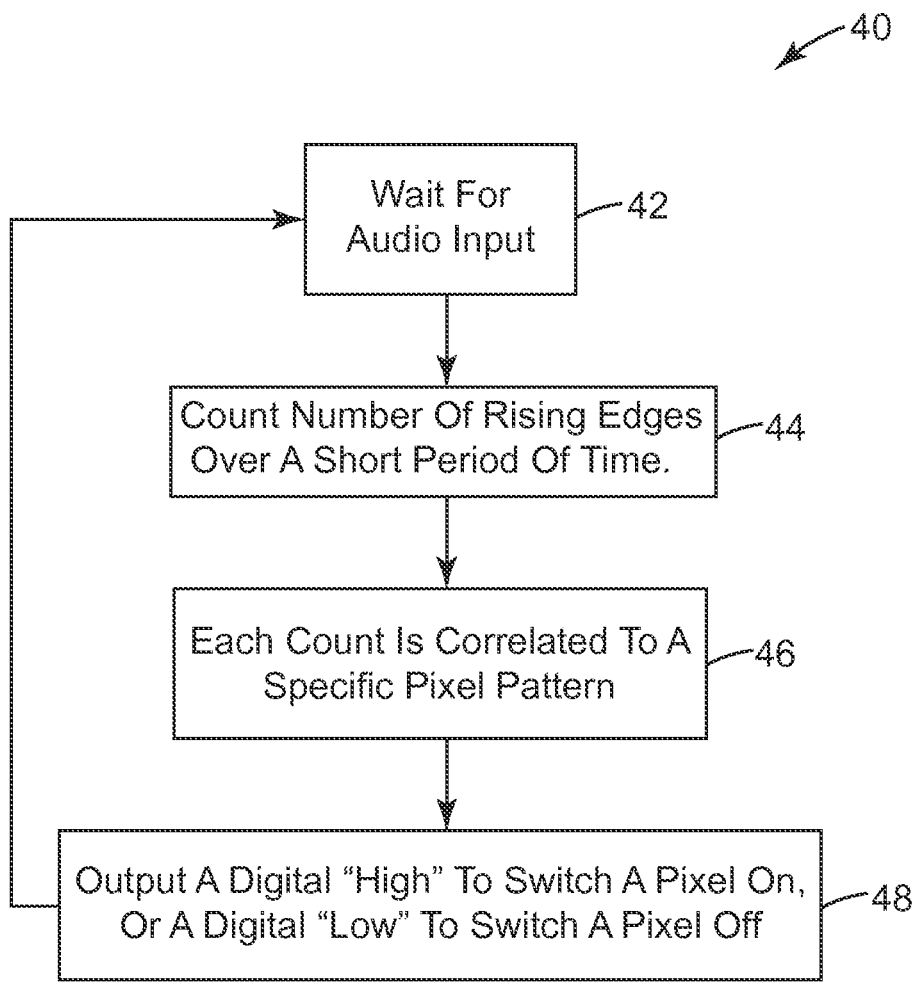
FIG. 3 is a flow chart of a method for audio encoding of data to control a transparent display.

FIG. 3 is a flow chart of a method 40 for audio encoding of data. Method 40 can be implemented in software, for example, for execution by processor 20 in system 10. In method 40, the system waits for audio input (step 42), which the system receives from the audio content in video and audio source 34. When receiving audio input, the system counts the number of rising edges of the signal over a short period of time (step 44). As the frequency increases, the counts increase accordingly. Each count is correlated to a specific pixel pattern (step 46). Based upon the correlated counts, a digital high signal is output to switch a particular pixel on in transparent display 32, and a digital low signal is output to switch a particular pixel off in transparent display 32 (step 48). The method repeats to continue decoding audio signals for synchronizing the projected video content from video and audio source 34 with the switching of pixels in transparent display 32.

Table 1 illustrates correlating pixel counts with pixel patterns and the on and off states for the pixels in each pattern. This correlation can be stored in memory, such as memory 21, for retrieving the corresponding pixel patterns to synchronize the display with video content. In the pixel states, the particular pixel patterns can specify the (x, y) positions of the pixels to turn on as represented by pixels(x, y) and the (x, y) positions of the pixels to turn off as represented by pixels(x', y'). As the projected video is displayed on the transparent display, the pixel patterns can change, as determined by the counts, to continue to display the projected video onto pixels in the off (hazy) state.

TABLE 1

| Count | Pixel Pattern | Pixel States |
|---|---|---|
| Count 1 | Pixel Pattern 1 | Pattern 1 pixels(x, y) - on; Pattern 1 pixels(x', y') - off |
| Count 2 | Pixel Pattern 2 | Pattern 2 pixels(x, y) - on; Pattern 2 pixels(x', y') - off |
| ... | ... | ... |
| Count N | Pixel Pattern N | Pattern N pixels(x, y) - on; Pattern N pixels(x', y') - off |

Figure 4:
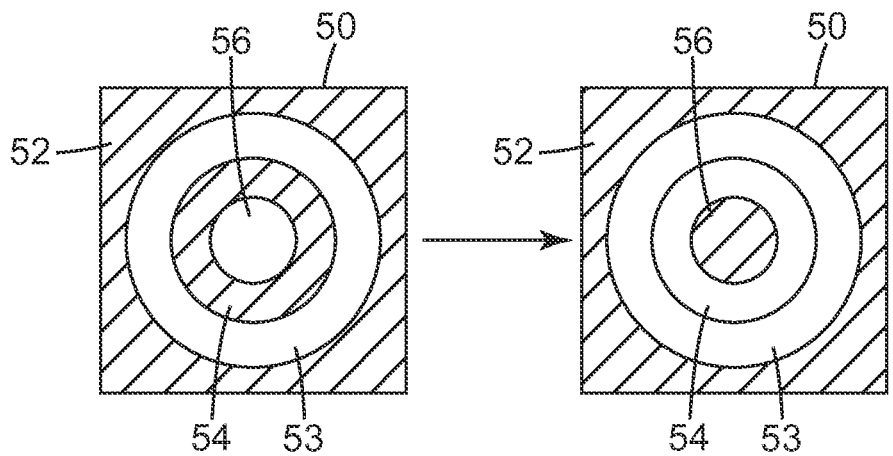
FIG. 4 is a diagram illustrating use of audio encoded data to control a transparent display.

FIG. 4 is a diagram illustrating use of audio encoded data to control switching of pixels in a transparent display. A transparent display 50 is has pixels in a background portion 52 and a ring portion 54 both set to a hazy state to display video content, while pixels in ring portion 53 and center portion 56 are set to a clear state. As the video changes, pixels in background portion 52 are still set to the hazy state and pixels in 53 are still set to a clear state, but pixels in ring portion 54 are now set to a clear state while pixels in center portion 56 are set to a hazy state to display video content in center portion 56 instead of ring portion 54. The configurations of pixels in clear and hazy states in the example of FIG. 4 can be stored as pixel patterns as illustrated in Table 1 and corresponding with particular counts.

Table 2 includes an example of BASIC code for implementing method 40. For example, the code in Table 2 can be stored in a memory associated with decoder 12, such as memory 21, for execution by processor 20.

TABLE 2

```
'---------------------------------------------------------------
'I/O Definitions
'---------------------------------------------------------------
INPUT 15
OUTPUT 10
OUTPUT 11
OUTPUT 12
OUTPUT 13
OUTPUT 8
'---------------------------------------------------------------
'Constant and Variable Definitions
'---------------------------------------------------------------
Reps VAR Word
freq VAR Word
'---------------------------------------------------------------
'Program
'---------------------------------------------------------------
Main:
    Pattern1:       'Determines PDLC Pattern (1=on (clear) 0=off (hazy))
        OUT10 = 0
        OUT11 = 1
        OUT12 = 1
        OUT13 = 1
        GOTO Cycle1   'After pixel pattern is set, jumps to "Cycle1"
    Pattern2:
        OUT10 = 0
        OUT11 = 0
        OUT12 = 0
        OUT13 = 0
        GOTO Cycle1
    Pattern3:
        OUT10 = 1
        OUT11 = 1
        OUT12 = 0
        OUT13 = 0
        GOTO Cycle1
    Pattern4:
        OUT10 = 1
        OUT11 = 1
        OUT12 = 1
```

TABLE 2-continued

```
OUT13 = 1
GOTO Cycle1
Cycle1:
FOR Reps = 1 TO 10000      'Begin Cycle (10000 is arbitrary)
   COUNT 15, 8, freq      'Determines the freq of the sound signal, also sets the freq of
the waveform
   IF freq < 4 THEN      'If there is no sound signal, go to the next loop
      GOTO Cycle2
   ENDIF
NEXT               'If there is a sound signal, repeat loop
GOTO Cycle1
Cycle2:
FOR Reps = 1 TO 10000
   COUNT 15, 8, freq
   IF freq > 4 THEN      'If there is a sound signal, go to the next loop
      GOTO Cycle3
   ENDIF             'If there is no sound signal, repeat loop
NEXT
GOTO Cycle2
Cycle3:
FOR Reps = 1 TO 10000
   COUNT 15, 8, freq
   ELSEIF freq > 28 THEN 'Determine the frequency of sound input, go to
corresponding pattern
      GOTO Pattern1
   ELSEIF freq > 20 THEN
      GOTO Pattern2
   ELSEIF freq > 12 THEN
      GOTO Pattern3
   ELSEIF freq > 4 THEN
      GOTO Pattern4
   ENDIF
   GOTO Cycle2
NEXT
GOTO Main
```

The invention claimed is:

1. A system for synchronizing projected video content with a transparent display, comprising:
a projector configured to receive video content and project the video content, wherein the video content has an associated audio content;
a transparent display for receiving the projected video content and having one or more pixels capable of switching between a clear state and a hazy state; and
a decoder for controlling the switching of the one or more pixels in the display between the clear and hazy states, wherein the decoder receives the audio content and decodes the audio content in order to synchronize the switching of the one or more pixels with the projected video content on the display such that the projected video content is projected onto one or more pixels in the hazy state.

2. The system of claim 1, wherein the decoder decodes audio tones in the audio content.

3. The system of claim 2, wherein the decoder determines a count from the audio tones, and the count corresponds with a particular pixel pattern on the display.

4. The system of claim 2, wherein the audio tones comprise a digital square wave.

5. The system of claim 2, wherein the audio tones comprise dual-tone multi-frequency tones.

6. The system of claim 2, wherein the decoded audio tones are within an ultrasonic range of the audio content.

7. The system of claim 1, wherein the transparent display comprises a polymer dispersed liquid crystal display.

8. The system of claim 1, wherein the transparent display comprises a plurality of pixels, and wherein the decoder synchronizes the plurality of pixels such that the pixels not receiving the projected video content are in the clear state.

9. The system of claim 1, wherein the decoded audio content corresponds with a stored pixel pattern for displaying the projected video content.

10. A method for synchronizing projected video content with a transparent display, comprising:
projecting video content to a transparent display, wherein the video content has an associated audio content;
displaying the projected video content on the transparent display, wherein the transparent display has one or more pixels capable of switching between a clear state and a hazy state; and
decoding the audio content in order to control the switching of the one or more pixels in the display between the clear and hazy states, comprising synchronizing the switching of the one or more pixels with the projected video content on the display such that the projected video content is projected onto one or more pixels in the hazy state.

11. The method of claim 10, wherein the decoding step comprises decoding audio tones in the audio content.

12. The method of claim 11 wherein the decoding step comprises determining a count from the audio tones, wherein the count corresponds with a particular pixel pattern on the display.

13. The method of claim 11, wherein the decoding step comprises decoding a digital square wave.

14. The method of claim 11, wherein the decoding step comprises decoding dual-tone multi-frequency tones.

15. The method of claim 11, wherein the decoding step comprises decoding audio tones within an ultrasonic range of the audio content.

16. The method of claim 10, wherein the displaying step comprises displaying the projected video content on a polymer dispersed liquid crystal display.

17. The method of claim 10, wherein the transparent display comprises a plurality of pixels, and wherein the decoding step comprises synchronizing the plurality of pixels such that the pixels not receiving the projected video content are in the clear state.

18. The method of claim 10, wherein the decoding step comprises retrieving a stored pixel pattern for displaying the projected video content.

19. A system for synchronizing projected video content with a transparent display, comprising:
   a projector configured to receive video content and project the video content, wherein the video content has an associated audio content;
   a transparent display for receiving the projected video content and having pixels capable of switching between a clear state and a hazy state; and
   a decoder for controlling the switching of the pixels in the display between the clear and hazy states,
   wherein the decoder receives the audio content and decodes the audio content in order to select a particular pixel pattern for the transparent display such that the pixels receiving the projected video content are in the hazy state and the pixels not receiving the projected video content are in the clear state.

20. The system of claim 19, wherein the decoder selects the particular pixel pattern by determining a frequency count within the audio content.

\* \* \* \* \*